United States Patent [19]
Vasudev et al.

[11] Patent Number: 5,418,095
[45] Date of Patent: May 23, 1995

[54] METHOD OF FABRICATING PHASE SHIFTERS WITH ABSORBING/ATTENUATING SIDEWALLS USING AN ADDITIVE PROCESS

[75] Inventors: Prahalad K. Vasudev; Kah K. Low, both of Austin, Tex.

[73] Assignees: Sematech, Inc., Austin, Tex.; Motorola, Inc., Schaumburg, Ill.

[21] Appl. No.: 307,548

[22] Filed: Sep. 16, 1994

Related U.S. Application Data

[63] Continuation of Ser. No. 7,640, Jan. 21, 1993, abandoned.

[51] Int. Cl.⁶ .............................................. G03F 9/00
[52] U.S. Cl. ........................................ 430/5; 430/312; 430/313; 430/314; 430/324; 430/326
[58] Field of Search .................. 430/5, 312, 313, 314, 430/321, 324, 326

[56] References Cited

U.S. PATENT DOCUMENTS

| | | | |
|---|---|---|---|
| 3,604,778 | 9/1971 | Burckhardt | 350/3.5 |
| 4,013,338 | 3/1977 | Sato et al. | 350/3.5 |
| 4,037,918 | 7/1977 | Kato | 350/3.5 |
| 4,068,018 | 1/1978 | Hashimoto et al. | 427/38 |
| 4,119,483 | 10/1978 | Hubsch et al. | 156/655 |
| 4,174,219 | 11/1979 | Andres et al. | 430/321 |
| 4,248,948 | 2/1981 | Matsuda | 430/5 |
| 4,360,586 | 11/1982 | Flanders et al. | 430/321 |
| 4,374,911 | 2/1983 | Hartley | 430/5 |
| 4,377,627 | 3/1983 | Vinton | 430/22 |
| 4,402,600 | 9/1983 | Araihara | 355/125 |
| 4,411,972 | 10/1983 | Narken et al. | 430/5 |
| 4,417,317 | 11/1983 | Culp et al. | 430/4 |
| 4,434,224 | 2/1984 | Yoshikawa et al. | 430/323 |
| 4,440,840 | 4/1984 | Yamaguchi | 430/4 |
| 4,529,686 | 7/1985 | Kraus | 430/314 |
| 4,575,399 | 3/1986 | Tanaka et al. | 156/272.8 |
| 4,686,162 | 8/1987 | Stangl et al. | 430/5 |
| 4,806,442 | 2/1989 | Shirasaki et al. | 430/4 |
| 4,806,454 | 2/1989 | Yoshida et al. | 430/321 |
| 4,842,969 | 6/1989 | Kawatsuki et al. | 430/5 |
| 4,852,973 | 8/1989 | Durnin et al. | 350/162 |
| 4,871,630 | 10/1989 | Giammarco et al. | 430/17 |
| 4,881,257 | 11/1989 | Nakagawa | 378/35 |
| 4,885,231 | 12/1989 | Chan | 430/321 |
| 4,890,309 | 12/1989 | Smith et al. | 378/35 |

(List continued on next page.)

FOREIGN PATENT DOCUMENTS

| | | | |
|---|---|---|---|
| 0395425 | 10/1990 | European Pat. Off. | |
| 447132A1 | 8/1991 | European Pat. Off. | |
| 470707A3 | 2/1992 | European Pat. Off. | |
| 0475694 | 3/1992 | European Pat. Off. | |
| 126361 | 7/1977 | Germany | |
| 61-292643 | 12/1986 | Japan | G03F 1/00 |
| 62-67514 | 3/1987 | Japan | G02F 1/00 |
| 62-50811 | 10/1987 | Japan | G03F 1/00 |
| 62-59296 | 12/1987 | Japan | G03F 1/00 |
| 63-80258 | 4/1988 | Japan | G03F 1/00 |
| 1-147458 | 6/1989 | Japan | G03F 1/00 |
| 2-78216 | 3/1990 | Japan | H01L 21/27 |
| 2-140743 | 5/1990 | Japan | G03F 1/08 |
| 3-252659 | 11/1991 | Japan | |

OTHER PUBLICATIONS

Patent Abstracts of Japan, vol. 17, No. 257, (E-1368) May 20, 1993, & JP,A,05 003 146 (Hitachi Ltd.) 8 Jan. 1993.

IBM Technical Disclosure Bulletin, vol. 29, No. 3, Aug. 1986, N.Y., US, p. 1328, 'Method to Produce Sizes in Openings in Photo Images Smaller than Lithographic Minimum Size'.

(List continued on next page.)

*Primary Examiner*—S. Rosasco
*Attorney, Agent, or Firm*—William W. Kidd

[57] ABSTRACT

A method of fabricating phase shifters with absorbing or attenuating sidewalls in order to inhibit or prevent light scattering at quartz-air interfaces. A quartz substrate is patterned and trenches are formed to provide "shifters". A metal film layer is formed along sidewalls of the trenches to provide the light absorbing characteristics. In one technique, the conformal metal layer is anisotropically etched while in another the metal layer is removed along with the photoresist by a lift-off technique.

16 Claims, 4 Drawing Sheets

U.S. PATENT DOCUMENTS

| | | | |
|---|---|---|---|
| 4,902,899 | 2/1990 | Lin et al. | 250/492 |
| 4,935,334 | 6/1990 | Boettiger et al. | 430/322 |
| 4,939,052 | 7/1990 | Nakagawa | 430/5 |
| 4,997,747 | 3/1991 | Yoshida et al. | 430/321 |
| 5,024,726 | 6/1991 | Fujiwara | 156/653 |
| 5,045,417 | 9/1991 | Okamoto | 430/5 |
| 5,079,113 | 1/1992 | Ohta et al. | 430/5 |
| 5,153,083 | 10/1992 | Garofalo et al. | 430/5 |
| 5,208,125 | 5/1993 | Lowrey et al. | 430/5 |
| 5,217,830 | 6/1993 | Lowrey | 430/5 |
| 5,219,686 | 6/1993 | Kamon | 430/311 |
| 5,225,035 | 7/1993 | Rolfson | 156/643 |
| 5,229,230 | 7/1993 | Kamon | 430/5 |

OTHER PUBLICATIONS

Patent Abstracts of Japan, vol. 16, No. 382 (P-14382) Aug. 14, 1992 & JP,A,04 123 060 (Fujitsu Ltd) 23 Apr. 1992 see abstract.

IBM Technical Disclosure Bulletin, vol. 25, No. 12, May 1983, NY US, pp. 6408-6414, 'Optical Recording Disc Ssytem and Memory Medium,' p. 6408.

International Conference on Macrolithography, Rome, Italy, 17-19 Sep. 1991, 79-85 ISSN 0167-9317, pp. 79-86, Lin BJ 'The optimum numerical aperture for attenuated phase-shifting masks'.

"Four More Significant Japanese Advances in Phase Shifting Technology," Semiconductor International, Dec. 1991, p. 16.

"Improved resolution of an i-line stepper using a phase-shifting mask," Tsuneo Terasawa et al., J. Vac. Sci. Technol. B 8(6) Nov./Dec. 1990, pp. 1300-1308.

"Fabrication of 64M Dram with i-Line Phase-Shift Lithography," K. Nakagawa et al., IEEE, Apr. 1990, pp. 817-820.

"Conjugate Twin-Shifter for the New Phase Shift Method to High Resolution Lithography," H. Ohtsuka et al., SPIE, vol. 1463, Optical/Laser Microlithography IV (1991), pp. 112-123.

"Exploration of Fabrication Techniques for Phase-Shifting Masks", A. K. Pfau et al., SPIE, vol. 1463, Optical/Laser Microlithography IV (1991), pp. 124-134.

"Transparent phase shifting mask with multistage phase shifter and comb-shaped shifter," Hisashi Watanabe et al., SPIE, vol. 1463, Optical/Laser Macrolithography IV (1991), pp. 101-110.

"Phase-Shifting Mask and FLEX Method for Advanced Photo-lithography," Hiroshi Fukuda et al., SPIE, vol. 1264, Optical/Laser Microlithography III (1990), pp. 14-25.

"New Phase Shifting Mask with Self-aligned Phase Shifers for a Quarter Micron Photolithography," Akihiro Nitayama et al., IEEE, Jul. 1989, pp. 57-60.

"The Phase-Shifting Mask II: Imaging Simulations & Submicrometer Resist Exposures," Marc D. Levenson et al., IEEE, vol. ED-31, No. 6, Jun. 1984, pp. 753-763.

"New phase-shifting mask with highly transparent $SiO_2$ phase shifters," Isamu Hanyu et al., SPIE vol. 1264 Optical/Laser Microlithography III (1990), pp. 167-177.

"Transparent Phase Shifting Mask," H. Watanabe et al., IEEE, Apr. 1990, pp. 821-824.

"A 5.9 $\mu m^2$ Super Low Power SRAM Cell Using a New Phase-Shift Lithography," T. Yamanaka et al., IEEE, Apr. 1990, pp. 477-480.

"Phase-Shift Mask Utilizing Silicon Oxy-Nitride as a Low Reflectivity Phase-Shift Layer," IBM Technical Disclosure Bulletin, vol. 34, No. 10B, Mar. 1992, pp. 360-361.

"Bilayer Metallic Antireflection Mirror," IBM Technical Disclosure Bulletin, vol,. 25, No. 1, Jun. 1982, pp. 48-50.

Patent Abstracts of Japan, Publication No. JP060637, Feb. 26, 1992, App. No. JP900172150, vol. 16, No. 252, Kitano Naoki, "Phase Shift Mask and Production Thereof".

"The Attenuated Phase-Shifting Mask," Burn J. Lin, Solid State Technology Jan. 1992, pp. 43-47.

"Fabrication of phase-shifting masks with shifter overcoat," R. L. Kostelak et al., 8257b Journal of Vacuum Science & Technology, B, 9(1991) Nov./Dec., No. 6, New York, US, pp. 3150-3154.

"Edge Effects in Phase-shifting Masks for 0.25 um Lithography," Alfred K. Wong and Andrew R. Neureuther, SPIE, vol. 1809, Aug. 1993, pp. 222-228.

"Phase Shift Masking Traced to 1976 Patent", Semiconductor International, Jun. 1993, pp. 32-34.

(List continued on next page.)

OTHER PUBLICATIONS

"Improving Resolution in Photolithography with a Phase-Shifting Mask", Marc D. Levenson et al., IEEE Transactions on Electron Devices, vol. ED-29, No. 12, Dec. 1982, pp. 1828-1836.

"0.2μm or Less I-Line By Phase-Shifting-Mask Technology", Hideyuki Jinbo and Yoshio Yamashita, Semiconductor Technology Lab, Oki Electric Industry Co., Japan, IEDM 90 (1990) pp. 825-828.

"Sub-Half-Micron i-Line Lithography by Use of LMR-UV Resist", Hideyki Jinbo et al., Japanese Journal of Applied Physics, vol. 28, No. 10, Oct., 1989, pp. 2053-2057.

"Subhalf-micron patterning of negative working resist by using new phase-shifting masks", Hideyuki Jinbo et al., Journal of Vacuum Science & Technology B, Second Series, vol. 8, No. 6, Nov./Dec. 1990, pp. 1745-1748.

"0.3-micron optical lithography using a phase-shifting mask", Tsuneo Terasawa et al., SPIE, vol. 1088 Optical/Laser Microlithography II (1989), pp. 25-32.

"What is a Phase-Shifting Mask?", Marc D. Levenson, SPIE, vol. 1496, 10th Annual Symposium on Microlithography (1990), pp. 20-26.

"Phase-Shifting and Other Challenges in Optical Mask Technology", Burn J. Lin, SPIE, vol. 1496, 10th Annual Symposium on Microlithography (1990) pp. 54-79.

"Modeling Phase Shifting Masks", Andrew R. Neureuther, SPIE, vol. 1496, 10th Symposium on Microlithography (1990), pp. 80-88.

"New phase-shifting mask with highly transparent $SiO_2$ phase shifters," I. Hanyu et al., SPIE Proceedings, vol., 1264, p. 167, 1990.

"New Phase Shfiting Mask with Self-aligned Phase Shifters for a Quarter Micron Photolithography," IEEE, A. Nitayama et al., IEDM Proceedings, IEDM-89, pp. 57-60, 1989.

"The Optimum Numerical Aperture for Optical Projection Microlithography" B. J. Lin et al., SPIE Proceedings, vol. 1463, pp. 42-53, 1991.

"The optimum numerical aperature for attenuated phase-shifting masks," B. J. Lin, Microelectronic Engineering 17 (1992) pp. 79-86.

"A critical examination of submicron optical lithography using simulated project images," Alan E. Rosenbluth et al., J. Vac. Sci. Technol. B1(4) Oct.-Dec. 1983, pp. 1190-1195.

METHOD OF FABRICATING PHASE SHIFTERS WITH ABSORBING/ATTENUATING SIDEWALLS USING AN ADDITIVE PROCESS

This application is a continuation of application Ser. No. 08/007,640, filed Jan. 21, 1993, now abandoned.

BACKGROUND OF THE INVENTION

1. Field of the Invention

The present invention relates to the field of fabricating photomasks for use in the manufacture of semiconductor devices and, more particularly, to the fabrication of phase shifting photomasks, having light absorbing sidewalls, for use in submicron lithography techniques.

2. Related Applications

This application is related to co-pending applications entitled, "Phase Shifting Mask Structure with Absorbing/Attenuating Sidewalls for Improved Imaging", Ser. No. 007,638, filed Jan. 21, 1993, and copending application entitled, "Phase Shifting Mask Structure with Multilayer Optical Coating for Improved Transmission", Ser. No. 607,639, filed Jan. 21, 1993.

3. Prior Art

Various techniques are known in the prior art for manufacturing devices on a semiconductor wafer, such as a silicon wafer. Typically, lithography processes are utilized to overlay a pattern(s) onto the wafer. Each pattern provides for selected portions of the wafer to undergo a particular lithographic process, such as deposition, etch, implant, etc. Photomasks (masks) are generally utilized to overlay a particular pattern on the wafer or a layer formed on the wafer. Generally a number of these masks are required for manufacturing a complete device on the wafer.

The earlier prior art lithography techniques rely upon optical techniques in which light is passed through a mask to overlay a pattern on the wafer. Generally, a pattern on the mask equated to a pattern design appearing on the surface of the wafer. However, as the semiconductor technology evolved to allow ever smaller device structures to be fabricated on a wafer, it became increasingly difficult to continue to use the standard optical techniques. It is generally theorized that as device features approach submicron dimensions of 0.25 microns and below, alternative techniques would be required to project patterns onto a wafer.

Due to the limitation imposed by the wavelength of light, resolution at the edges of these patterns tend to degrade when ordinary optical techniques are employed. Standard optical techniques utilizing ultra violet (UV) light will extend the lower range, but still fall short of desired resolution at extremely low ranges (under 0.25 microns). It was generally believed that technologies employing shorter wavelength would ultimately be required for lithography. A number of approaches have been suggested with x-ray lithography being viewed as the technology for use at these low submicron ranges.

However, recent experimentation in the area of phase shifting masks (PSMs) have shown that the PSM technology can be employed to extend the range of optical techniques currently being utilized. That is, the current I-line (at a wavelength of 356 nanometers) and deep ultra violet, or DUV (at a wavelength of 248 nanometers), optical photolithography techniques can be used with the phase shifting photomasks to provide the requisite resolution with sufficient depth of focus for fabricating semiconductor devices having dimensions in the order of 0.25 microns and below. It is believed that resolutions in the order of 0.1 micron resolution levels can be obtained with sufficient focus latitude by the use of ordinary lithography techniques when phase shifting techniques are applied.

It is generally understood that the technique for improving resolution in photolithography by the use of phase-shifting masks was first proposed by Levenson et al., ("Improving Resolution in Photolithography with a Phase-Shifting Mask", IEEE Transactions on Electron Devices, Vol. ED-29, No. 12, December 1982, pp. 1828–1836) and later implemented by Terasawa et al. ("0.3-micron optical lithography using a phase-shifting mask", Proceedings of SPIE, Vol. 1088 Optical/Laser Microlithography II, 1989, pp. 25–32).

The conventional PSM comprises of creating phase shifting regions in the transparent areas of a photomask. These phase-shifting regions are formed either by depositing transparent films of appropriate thickness and then patterning them over the desired transparent areas using a second level lithography and etch technique or by etching vertical trenches into the quartz substrate. In both of these instances, the "edges" or ("walls") between the phase shifted and unshifted regions mostly result in a transition between high and low refractive index regions.

This sharp transition of the refractive index and the three dimensional structure cause scattering of light due to internal reflections at the edges and causes the transmitted light intensity and spacial profile to vary between the shifted region and the unshifted region and also leads to the "waveguiding" effect. The "waveguiding" effect results in the "funneling" of light into a narrow region in the "phase shifted" areas thereby causing nonuniformity in the aerial image spacial profile. Consequently, the imaging characteristics of conventional PSMs and uniformity of linewidths are degraded and is less than optimum. This degradation in linewidth uniformity also leads to problems with maintaining a desired aerial image in exposure characteristics.

It is appreciated that a technique that would reduce the scattering of light at the transition regions and eliminate the waveguiding effect would provide for a PSM having improved image and exposure characteristics, as well as maintaining a desired uniformity of linewidths across the entire printed image field. A type of PSM utilizing a light absorbing/attenuating sidewall is described in afore-mentioned copending application entitled "Phase Shifting Mask Structure with Absorbing/Attenuating Sidewalls for Improved Imaging". A method of fabricating such phase shifters is described herein.

SUMMARY OF THE INVENTION

A method of fabricating phase shifters with absorbing/attenuating sidewalls in order to improve resolution, linewidth uniformity and depth of focus in a PSM is described. The PSM of the present invention utilizes shifters in which trenches are formed in a quartz substrate to provide the 180° phase shift.

After the trenches are patterned and formed, a conformal metal layer is deposited over the substrate, including the trench regions. Then, anisotropic dry etching removes the metal layer except for the vertical area adjacent to sidewalls of the trenches. The absorbing/attenuating sidewall inhibits or prevents scattering of light at the sidewall region when light transitions across the quartz-air interface of the PSM. The absorbing sidewall is shown being formed on an unattenuating PSM and on a Levenson-type PSM. However, it is applicable to other types of PSM as well.

In an alternative method, the conformal metal layer is deposited prior to the removal of the patterned photoresist. Then, a "lift-off" technique is used in which the photoresist is removed by dissolution using a shaking or an agitating action in a liquid solvent. The metal layer overlying the photoresist is removed along with the photoresist breaking away from the entire film so that only the metal layer in the trenches remain.

DETAILED DESCRIPTION OF THE PREFERRED EMBODIMENT

A method for fabricating phase shifters with absorbing or attenuating sidewalls using an additive process is described. In the following description, numerous specific details are set forth, such as specific structures, layers, materials, etc., in order to provide a thorough understanding of the present invention. However, it will be obvious to one skilled in the art that the present invention may be practiced without these specific details. In other instances, well-known processes and structures have not been described in detail in order not to unnecessarily obscure the present invention.

Furthermore, the method described herein can be readily adapted for forming a variety of light absorbing or attenuating layers, but the preferred application is for the purpose of forming light absorbing/attenuating sidewalls along trench sidewalls of phase shifting masks (PSMs). A PSM utilizing a trench shifter which includes a light absorbing/attenuating sidewall is described in copending application entitled "Phase Shifting Mask Structure with Absorbing/Attenuating Sidewalls for Improved Imaging", Ser. No. 007,638, filed Jan. 21, 1993, which is incorporated by reference herein.

Referring to FIGS. 1A–E, a method for forming a phase shifter having conducting sidewalls for light absorption or attenuation in an unattenuated photomask is illustrated. The unattenuated photomask 10a is formed from a quartz substrate 11a which generally has an index of refraction of 1.5. Then, a layer of photoresist 12a is formed on the quartz substrate 11a, and patterned using standard lithography techniques in order to form patterned openings 13a which expose the underlying substrate 11a. Subsequently, a dry etching process (preferably one using a fluorine chemistry), such as a process utilizing carbon tetrafluoride ($CF_4$) plasma, is used to etch an opening 14a (also referred to as a trench) into substrate 11a to a depth "$d_1$" as noted in FIG. 1C.

Figure 1A:
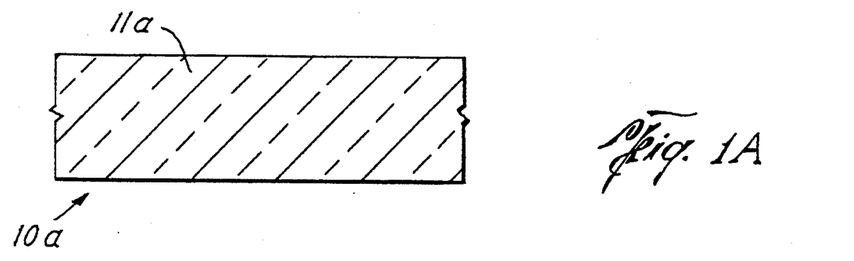
FIG. 1A is a cross-sectional diagram showing a quartz substrate used in forming an unattenuated PSM of the present invention.
Figure 1B:
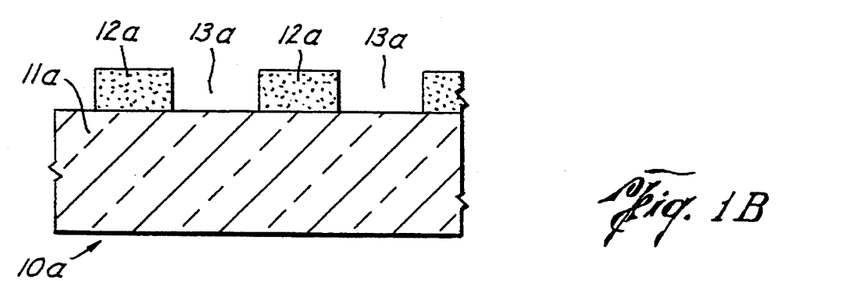
FIG. 1B is a cross-sectional diagram showing a formation of patterned photoresist atop the substrate of FIG. 1A.
Figure 1C:
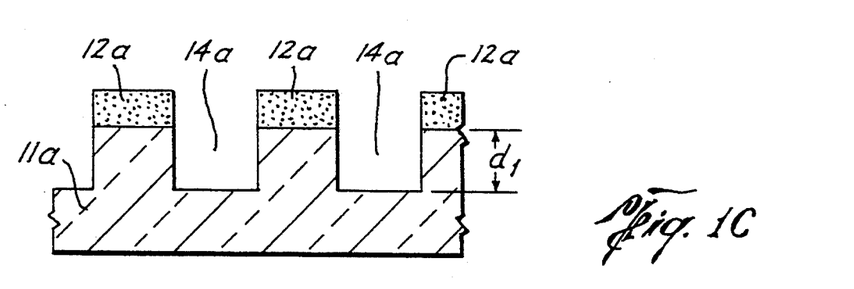
FIG. 1C is a cross-sectional diagram showing a formation of trenches in the substrate of FIG. 1B which are utilized to form "shifter" regions.
Figure 1D:
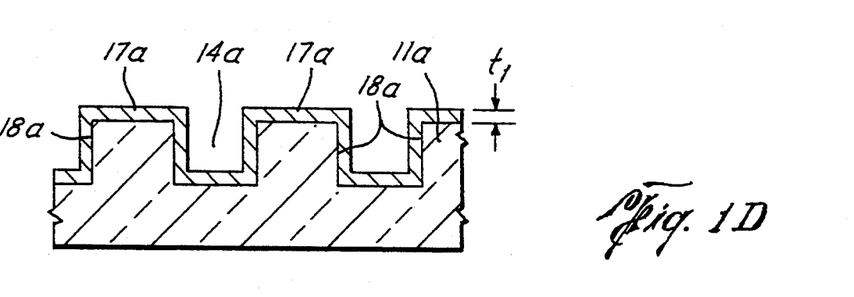
FIG. 1D is a cross-sectional diagram showing a formation of a conforming metal layer over the substrate once the photoresist is removed from the illustration of FIG. 1C.

Trench 14a cuts into the substrate 11a and thereby forms a phase shifter of mask 10a. Then, the remaining photoresist 12a is then stripped. Afterwards, a thin film layer of metallic absorber material 17a is conformally deposited over the substrate 11a and trench 14a, as shown in FIG. 1d. Sidewalls 18a of trench 14a also are covered by the metallic material 17a. Typically, thickness $t_1$ of the metallic absorbing layer 17a is in the order of approximately 100 to 500 angstroms. Conformal deposition of layer 17a can be readily achieved by chemical vapor deposition (CVD), sputtering (such as collimated sputtering) or by evaporation of metal.

Figure 1E:
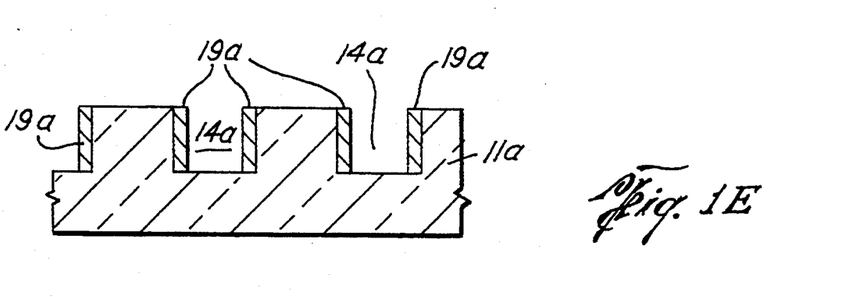
FIG. 1E is a cross-sectional diagram showing absorbing sidewalls once the metal layer of FIG. 1D is anisotropically etched.

Finally, a subsequent etching technique, such as a sputter etch in argon ($Ar^+$) plasma or, alternatively, an reactive ion etching (RIE) technique using Chlorine or the appropriate chemistry is used to anisotropically remove the metallic film 17a, including the film located at the bottom of the trench. The anisotropic etching removes all of metal layer 17a except for a portion adjacent to sidewalls 18a due to its vertical profile. Thus, an edge coating remains along the sidewalls 18a forming absorbing/attenuating sidewall layer 17a within trench 14a. This type of anisotropic etching occurs naturally in RIE etch equipment. The RIE etch process adjusted for the metal film stops on the quartz substrate 11a such that precise control of etching time or introduction of etch stops are not required. In sputter etching, the selectivity is high due to the considerable difference in the sputter rates of metal versus quartz. Thus, the resultant absorbing sidewall 19a for preventing or reducing (attenuating) edge scattering at the sidewall is formed.

Referring to FIGS. 2A-E, a formation of a light absorbing/attenuating sidewall on an Levenson-type PSM 10b is described. The process is similar to that described in reference to unattenuated PSM 10a of FIGS. 1A-E with the difference that the Levenson PSM 10b employs chromium (Cr) regions 20b atop the quartz. These chromium regions (blanks) 20b are also referred to as opaque regions in standard binary intensity masks. The formation of a chromium film of approximately 1000-2500 angstroms is formed and patterned on the quartz substrate 11b. As in the earlier process, a photoresist is formed over the substrate 11b and chromium opaque region 20b. However, as is noted in FIG. 2B, it is not critical to have the edge of the photoresist define the location of trench 14b since the edges of the chromium blank 20b will define the edge location by self-alignment. In the particular example of FIG. 2B, photoresist 12b is patterned to have an opening 13b only between two of the chromium blanks 21b and 22b, while the photoresist layer 12b completely covers the other separation between the chromium blanks 22b and 23b.

Figure 2A:
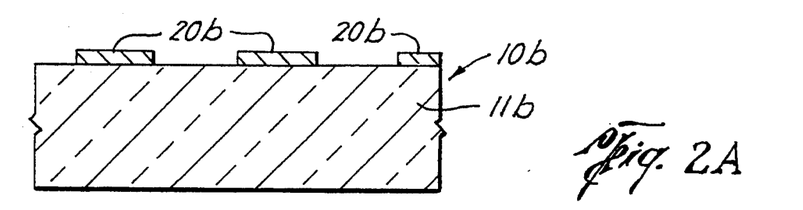
FIG. 2A is a cross-sectional diagram showing chromium blanks atop a quartz substrate used in forming a Levenson type PSM of the present invention.
Figure 2B:
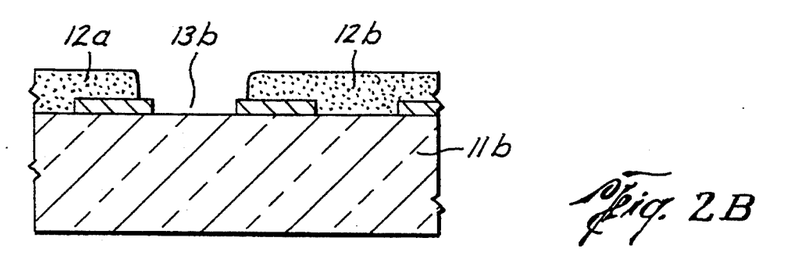
FIG. 2B is a cross-sectional diagram showing a formation of a patterned photoresist atop the substrate and the blanks of FIG. 2A.
Figure 2C:
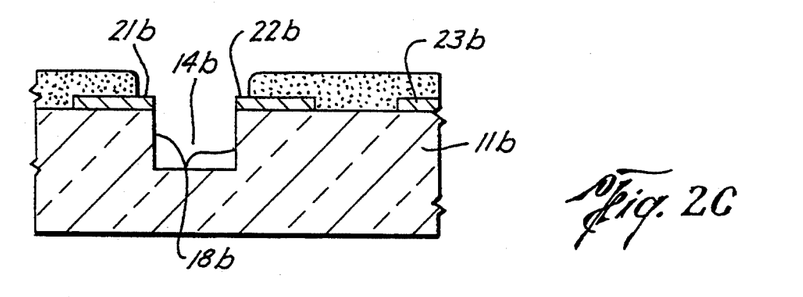
FIG. 2C is a cross-sectional diagram showing a formation of a trench in the substrate of FIG. 2B which is utilized to form a "shifter" region.
Figure 2D:
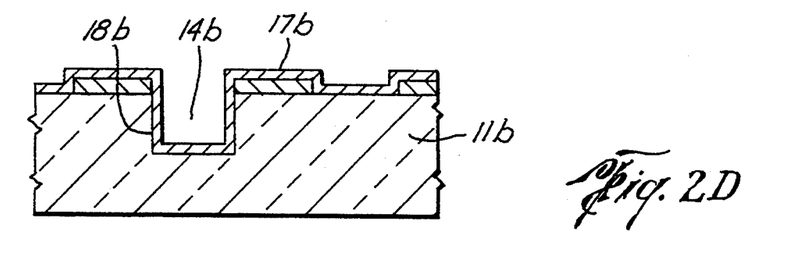
FIG. 2D is a cross-sectional diagram showing a formation of a conforming metal layer over the substrate once the photoresist is removed from the illustration of FIG. 2C.
Figure 2E:
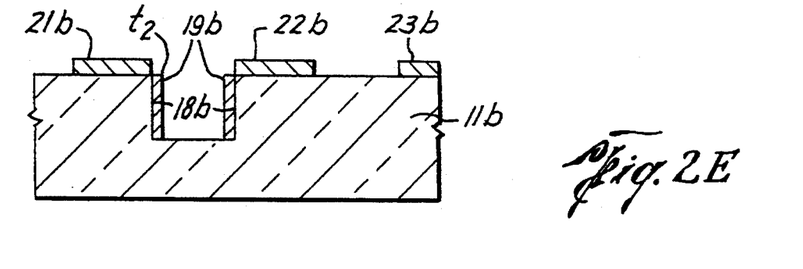
FIG. 2E is a cross-sectional diagram showing absorbing sidewalls once the metal layer of FIG. 2D is anisotropically etched.

Subsequently, using a dry-etch process, trench 14b is formed into quartz 11b. The sidewalls 18b of trench 14b are aligned with the edge of the two chromium blanks 21b and 22b. Due to the presence of the photoresist 12b an opening is not formed between chromium blanks 22b and 23b. Next, the photoresist layer 12b is removed by using a strip process. Then the conforming metal layer 17b is deposited over both the substrate 11b, including trench 14b, and over chromium blanks 20b by one of the processes described earlier. Then using either of the sputter etch or the RIE etch techniques, metal film 17b is anisotropically removed leaving a metal layer 17b only adjacent to vertical sidewalls 18b to form absorbing sidewalls 19b. Thus, absorbing/attenuating sidewalls 19b are formed within trench 14b and only adjacent to the sidewalls 18b. The thickness $t_2$ of the sidewalls 19b are equivalent to that of $t_1$, earlier described.

Figure 3A:
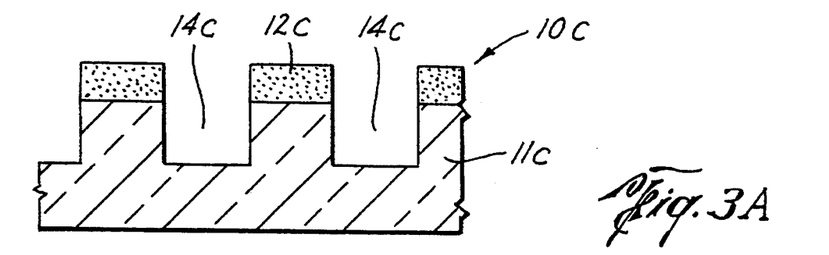
FIG. 3A is a cross-sectional diagram showing trench formation after photo resist patterning in fabricating an unattenuated PSM.
Figure 3B:
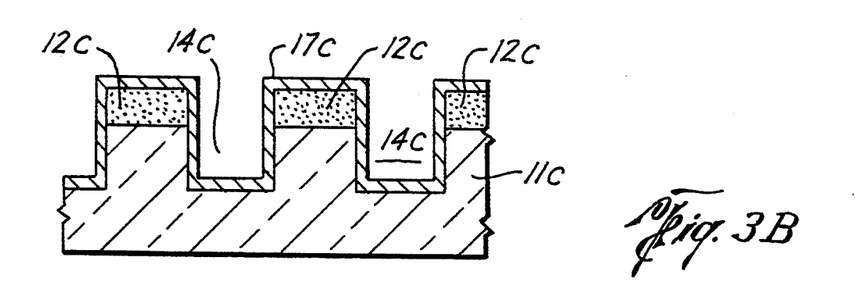
FIG. 3B is a cross-sectional diagram showing a formation of a conforming metal layer over the substrate and photoresist of FIG. 3A.

Referring to FIGS. 3A-C and 4A-C, methods for forming an absorbing sidewall using an alternative "lift-off" process for the unattenuated and Levenson-type PSMs are shown. In FIG. 3A, trench opening 14c is formed in substrate 11c by the process described in reference to FIGS. 1A-1C. Subsequently, instead of removing the photoresist 12c, metal film layer 17c is deposited over both the photoresist 12c and substrate 11c at or near room temperature. The conformal metal layer is deposited by collimated sputtering as shown in FIG. 3B.

Figure 3C:
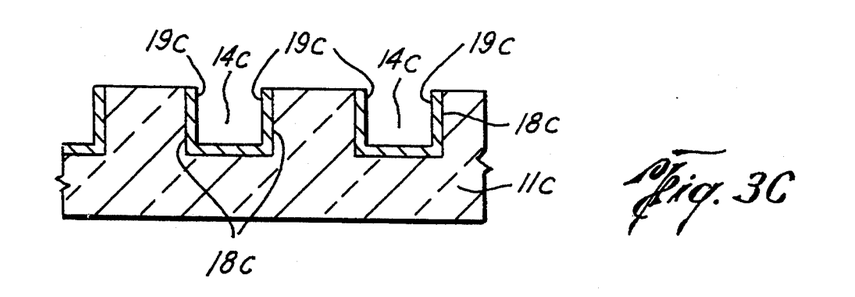
FIG. 3C is a cross-sectional diagram showing the remaining metal layer in the shifter trenches after a "lift-off" process is used to remove the photoresist of FIG. 3B.

Next, the photoresist 12c is dissolved in a hot developer (or other liquid solvent) while a shaking or agitating force is used to break the photoresist 12c and metal film 17c located atop the photoresist 12c. The photoresist 12c and its overlying metal film 17c breaks and is dislodged from the quartz 11c. As is noted in FIG. 3C, once the photoresist 12c and the overlying metal layer 17c are removed, only the metallic coating within trenches 14c remain. Thus, the phase shifters of PSM 10c formed by trenches 14c will have a metallic layer 17c on the entire shifter surface, and not only along the sidewalls 18c.

It is to be noted that the "lift-off" process can be utilized when the film has a thickness toward the lower end of the range. It is preferred that the thickness of metal film 17c be kept at under 150 angstroms for the "lift-off" method to be used. Because of this smaller thickness, absorption of light at the bottom of the trench (due to the bottom film layer) is kept to a minimum.

Figure 4A:
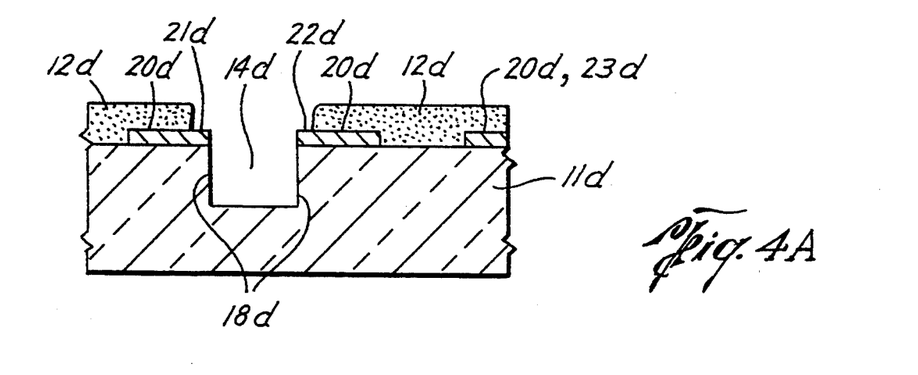
FIG. 4A is a cross-sectional diagram showing trench formation after photoresist patterning in fabricating a Levenson type PSM.
Figure 4B:
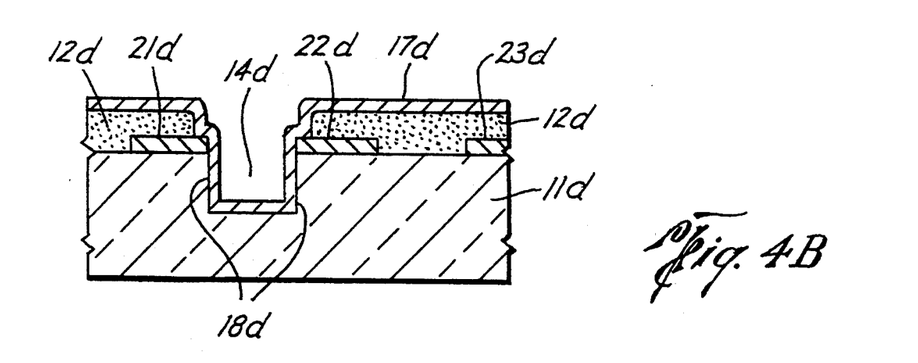
FIG. 4B is a cross-sectional diagram showing a formation of a conforming metal layer over the substrate, blanks and photoresist of FIG. 4A.
Figure 4C:
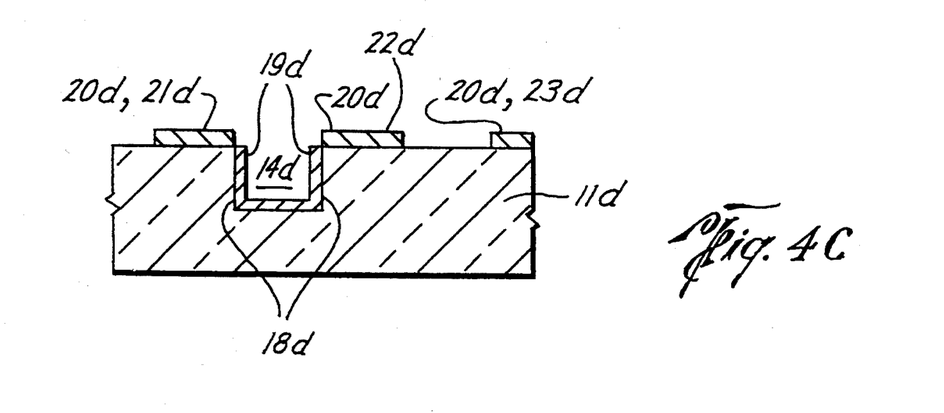
FIG. 4C is a cross-sectional diagram showing the remaining metal layer in the shifter trench after "lift-off" process is used to remove the photoresist of FIG. 4B.

FIGS. 4A-C show a similar process but on the Levenson-type PSM 10d which employs chromium blanks 20d. A photoresist layer 12d is formed overlying portions of substrate 11d and blanks 20d. Again, as was noted earlier in reference to FIGS. 2A-E, the actual location of the edge of the photoresist 12d defining the trench 14d is not as critical in the Levenson-type PSM since pads 21d and 22d define the sidewalls 18d for trench 14d. FIG. 4A shows the process as described in reference to FIGS. 2A-C.

Subsequently, prior to the removal of the photoresist 12d, a metal film layer 17d is deposited above substrate 11d, chromium blanks 20d and photoresist 12d, as is shown in FIG. 4B. Again, the resist is dissolved in a hot developer with the aid of a shaking or agitating action to break the photoresist 12d and metal film 17d overlying the photoresist 12d. The removal of the photoresist 12d and the overlying metal layer 17d essentially leaves only the metal conformal layer within trench 14d. Thus, the metal layer 17d is present along the sidewalls 18d and at the base of the trench 14d which forms the shifter portion of the PSM 10d. Again, this "lift-off" process is available for film thicknesses of under 150 angstroms.

The various types of materials for use in forming the absorbing sidewall 19a-d is a design choice and is noted in the afore-mentioned copending application. Preferred materials are conducting materials, such as molybdenum, chromium, aluminum, gold, their alloys and silicides. Silicon can also be utilized, but its thickness must be appropriately designed.

It is to be appreciated that absorbing/attenuating sidewalls can be readily implemented in variety of situations involving PSMs. It is to be further appreciated that the present invention can be readily utilized with other types of PSMs, such as Rim, subresolution and attenuated PSMs, without departing from the scope and spirit of the present invention. For example, in the case of attenuating PSMs, the method described herein can be used for both the opaque regions as well as sidewall absorbers in a single lithography step.

Thus, a method of fabricating a phase shifting mask invention with absorbing/attenuating sidewalls or attenuating phase shifters for improved imaging is described.

We claim:

1. A method of fabricating a phase shifting photomask having light absorbing sidewalls along boundaries separating phase shifting regions from nonshifting regions in order to improve resolution and contrast of a projected image field, comprising the steps of:

forming a patterned photosensitive layer over a mask substrate in which patterned openings expose portions of said underlying substrate;

etching said exposed portions of said substrate to form vertical trenches in said substrate, said trenches functioning as said phase shifting regions for providing a phase difference in a transmission of incident light through said substrate at trenched versus nontrenched regions, said trenches having vertical sidewalls which delineate a separation between said phase shifting regions and nontrenched, nonshifting regions;

removing said photosensitive layer;

depositing a thin film layer of a light absorbing or attenuating material over said substrate and covering sidewall surfaces of said vertical trenches;

etching said thin film layer such that said thin film layer substantially remains only on said sidewall surfaces of said trenches to form said light absorbing sidewalls;

wherein said light absorbing sidewalls absorb at least a portion of light energy impinging on said sidewalls in order to inhibit scattering of light along said boundaries and to reduce waveguiding effects within said phase shifting regions, such that distortion and non-uniform light intensity projection are reduced to provide improved resolution and contrast of said projected image field.

2. The method of claim 1 wherein said thin film layer is deposited to a thickness of 100–500 angstroms.

3. The method of claim 2 wherein said thin film layer is formed from a metallic material.

4. The method of claim 2 wherein said thin film layer is formed from a silicon material.

5. A method of fabricating a phase shifting photomask having light absorbing sidewalls along boundaries separating phase shifting regions from other regions in order to improve resolution and contrast of a projected image field, comprising the steps of:

forming a patterned photosensitive layer over a mask substrate having opaque regions disposed thereon and in which patterned openings expose portions of said underlying substrate;

etching said exposed portions of said substrate to form vertical trenches in said substrate adjacent to said opaque regions, said trenches functioning as said phase shifting regions for providing a phase difference in a transmission of incident light through said substrate at trenched versus nontrenched regions, said trenches having vertical sidewalls which delineate a separation between said phase shifting regions and said opaque regions;

removing said photosensitive layer;

depositing a thin film layer of a light absorbing or attenuating material over said substrate and covering sidewall surfaces of said vertical trenches;

etching said thin film layer such that said thin film layer substantially remains only on said sidewall surfaces of said trenches to form said light absorbing sidewalls;

wherein said light absorbing sidewalls absorb at least a portion of light energy impinging on said sidewalls in order to inhibit scattering of light along said boundaries and to reduce waveguiding effects within said phase shifting regions, such that distortion and non-uniform light intensity projection are reduced to provide improved resolution and contrast of said projected image field.

6. The method of claim 5 wherein said thin film layer is deposited to a thickness of 100–500 angstroms.

7. The method of claim 6 wherein said thin film layer is formed from a metallic material.

8. The method of claim 6 wherein said thin film layer is formed from a silicon material.

9. A method of fabricating a phase shifting photomask having light absorbing sidewalls along boundaries separating phase shifting regions from nonshifting regions in order to improve resolution and contrast of a projected image field, comprising the steps of:

forming a patterned photosensitive layer over a mask substrate in which patterned openings expose portions of said underlying substrate;

etching said exposed portions of said substrate to form vertical trenches in said substrate, said trenches functioning as said phase shifting regions for providing a phase difference in a transmission of incident light through said substrate at trenched versus nontrenched regions, said trenches having vertical sidewalls which delineate a separation between said phase shifting regions and nontrenched, nonshifting regions;

depositing a thin film layer of a light absorbing or attenuating material over said photosensitive layer and said substrate and covering sidewall surfaces of said vertical trenches;

applying a physical force to dislodge said patterned photosensitive layer which removal also dislodges portions of said thin film layer overlying said photosensitive layer such that said thin film layer substantially remains only in said vertical trenches to form said light absorbing sidewalls;

wherein said light absorbing sidewalls absorb at least a portion of light energy impinging on said sidewalls in order to inhibit scattering of light along said boundaries and to reduce waveguiding effects within said phase shifting regions, such that distortion and non-uniform light intensity projection are reduced to provide improved resolution and contrast of said projected image field.

10. The method of claim 9 wherein said thin film layer is deposited to a thickness of 100–500 angstroms.

11. The method of claim 10 wherein said thin film layer is formed from a metallic material.

12. The method of claim 10 wherein said thin film layer is formed from a silicon material.

13. A method of fabricating a phase shifting photomask having light absorbing sidewalls along boundaries separating phase shifting regions from other regions in order to improve resolution and contrast of a projected image field, comprising the steps of:

forming a patterned photosensitive layer over a mask substrate having opaque regions disposed thereon and in which patterned openings expose portions of said underlying substrate;

etching said exposed portions of said substrate to form vertical trenches in said substrate adjacent to said opaque regions, said trenches functioning as said phase shifting regions for providing a phase difference in a transmission of incident light through said substrate at trenched versus nontrenched regions, said trenches having vertical sidewalls which delineate a separation between said phase shifting regions and said opaque regions;

depositing a thin film layer of a light absorbing or attenuating material over said photosensitive layer and said substrate and covering sidewall surfaces of said vertical trenches;

applying a physical force to dislodge said patterned photosensitive layer which removal also dislodges portions of said thin film layer overlying said photosensitive layer such that said thin film layer substantially remains only in said vertical trenches to form said light absorbing sidewalls;

wherein said light absorbing sidewalls absorb at least a portion of light energy impinging on said sidewalls in order to inhibit scattering of light along said boundaries and to reduce waveguiding effects within said phase shifting regions, such that distortion and non-uniform light intensity projection are reduced to provide improved resolution and contrast of said projected image field.

14. The method of claim 13 wherein said thin film layer is deposited to a thickness of 100–500 angstroms.

15. The method of claim 14 wherein said thin film layer is formed from a metallic material.

16. The method of claim 14 wherein said thin film layer is formed from a silicon material.

* * * * *

UNITED STATES PATENT AND TRADEMARK OFFICE
CERTIFICATE OF CORRECTION

PATENT NO. : 5,418,095
DATED : May 23, 1995
INVENTOR(S) : Prahalad K. Vasudev, et. al.

It is certified that error appears in the above-indentified patent and that said Letters Patent is hereby corrected as shown below:

Column 1, line 23, "607,639" should be --007,639--.

Signed and Sealed this

Twenty-ninth Day of July, 1997

Attest:

BRUCE LEHMAN

Attesting Officer

Commissioner of Patents and Trademarks